US012487082B2

(12) United States Patent
Kobayashi et al.

(10) Patent No.: US 12,487,082 B2
(45) Date of Patent: Dec. 2, 2025

(54) METHOD FOR POSITIONING SUBSTRATE

(71) Applicant: JEL CORPORATION, Hiroshima (JP)

(72) Inventors: Tsuyoshi Kobayashi, Hiroshima (JP);
Toru Yuki, Hiroshima (JP); Kisato
Hirata, Hiroshima (JP)

(73) Assignee: JEL CORPORATION (JP)

( * ) Notice: Subject to any disclaimer, the term of this patent is extended or adjusted under 35 U.S.C. 154(b) by 248 days.

(21) Appl. No.: 17/636,764

(22) PCT Filed: May 14, 2020

(86) PCT No.: PCT/JP2020/019236
§ 371 (c)(1),
(2) Date: Feb. 18, 2022

(87) PCT Pub. No.: WO2021/033377
PCT Pub. Date: Feb. 25, 2021

(65) Prior Publication Data
US 2022/0299317 A1    Sep. 22, 2022

(30) Foreign Application Priority Data

Aug. 22, 2019 (JP) ................. 2019-152239

(51) Int. Cl.
H01L 21/68     (2006.01)
G01B 11/27     (2006.01)
(52) U.S. Cl.
CPC .......... *G01B 11/272* (2013.01); *H01L 21/68* (2013.01)
(58) Field of Classification Search
CPC ..... G01B 11/272; G01B 11/26; G01B 11/026; G01B 11/028; G01B 11/03; G01B 11/27;
(Continued)

(56) References Cited

U.S. PATENT DOCUMENTS

2007/0188859 A1*  8/2007  Tokita ............... H01L 21/681
                                                    359/394
2007/0258085 A1   11/2007  Robbins et al.
(Continued)

FOREIGN PATENT DOCUMENTS

CN    101238416 A    8/2008
CN    103079746 A    5/2013
(Continued)

OTHER PUBLICATIONS

International Search Report and Written Opinion for PCT/JP2020/019236, mailed Jul. 21, 2020.
(Continued)

*Primary Examiner* — Michelle M Iacoletti
*Assistant Examiner* — Judy Dao Tran
(74) *Attorney, Agent, or Firm* — MASCHOFF BRENNAN

(57) ABSTRACT

A method for adjusting a position of a substrate, includes: acquiring primary positional data indicating the positions of the edge portions (S31); acquiring secondary positional data indicating the positions of the edge portions after a stage has been moved (S33); calculating, using the primary positional data and the secondary positional data, difference amounts between the positions of the edge portions before the stage has been moved and the positions of the edge portions after the stage has been moved; and calculating an optical magnification ratio of each of the edge portions from each of the difference amounts and an amount of movement of the stage and correcting each of the positions of the edge portions of the primary positional data based on the calculated optical magnification ratio of each of the edge portions, thereby acquiring corrected positional data (S34).

5 Claims, 15 Drawing Sheets

(58) Field of Classification Search
CPC .. H01L 21/68; H01L 21/681; H01L 21/67259
USPC .......................................................... 356/138
See application file for complete search history.

(56) References Cited

U.S. PATENT DOCUMENTS

| | | | |
|---|---|---|---|
| 2008/0030731 A1* | 2/2008 | Jin ..................... | G01N 21/4738 356/417 |
| 2017/0329241 A1 | 11/2017 | Zhang et al. | |
| 2019/0025342 A1* | 1/2019 | Mori .................. | G01R 31/2891 324/750.23 |

FOREIGN PATENT DOCUMENTS

| | | | |
|---|---|---|---|
| JP | H09218714 A | | 8/1997 |
| JP | 2002151575 A | | 5/2002 |
| JP | 2003185419 A | | 7/2003 |
| JP | 2008196855 A | * | 8/2008 |
| JP | 2008203151 A | * | 9/2008 |
| JP | 2008203182 A | | 9/2008 |
| JP | 2016063028 A | | 4/2016 |

OTHER PUBLICATIONS

The First Office Action issued by the China National Intellectual Property Administration (CNIPA) dated Jan. 21, 2024 for the Chinese Patent Application No. CN202080058556.X. (English translation included).
The First Office Action issued by the Korean Intellectual Property Office (KIPO) dated Jan. 2, 2024 for the Korean Patent Application No. 10-2022-7007495. (English translation included).

* cited by examiner

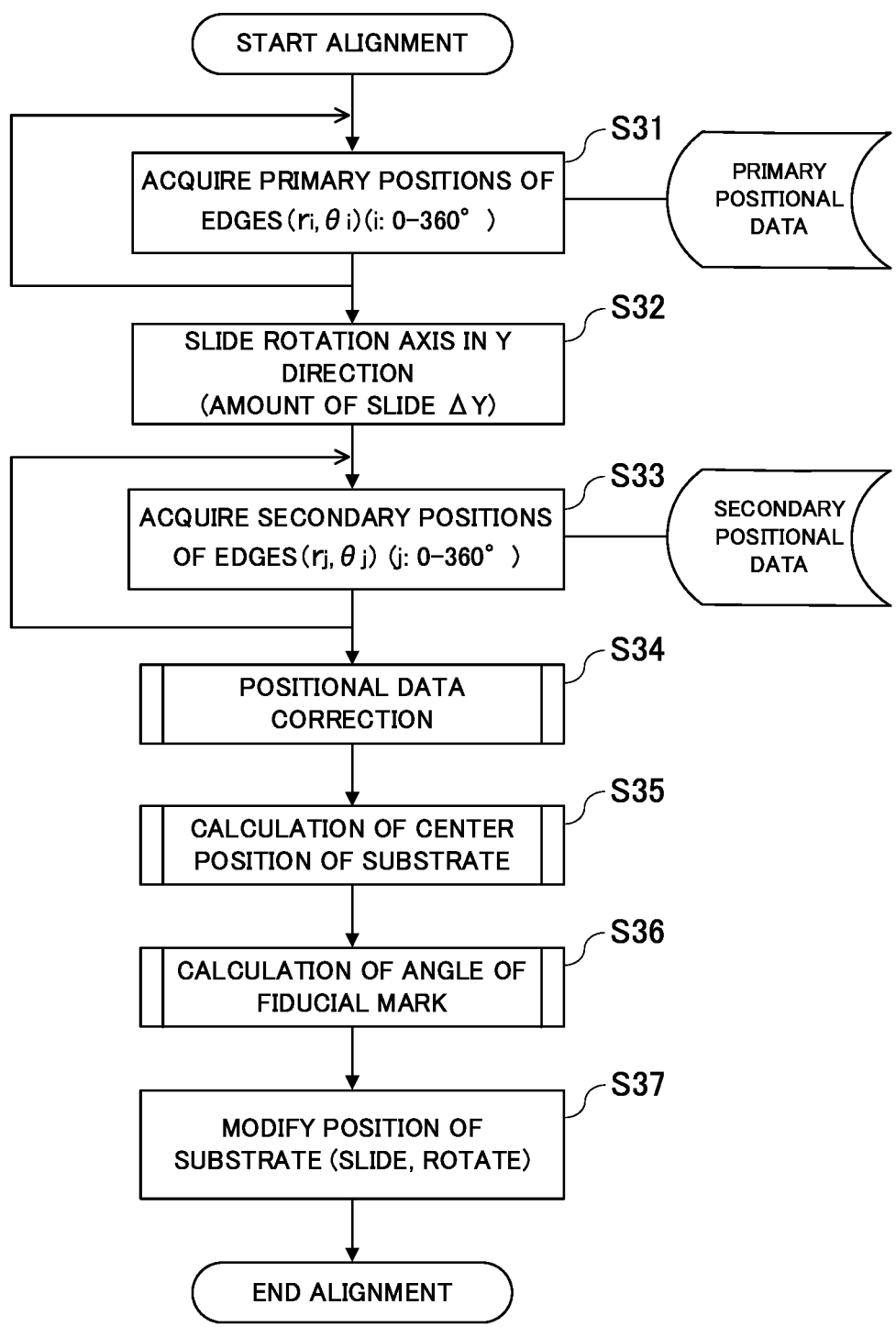

METHOD FOR POSITIONING SUBSTRATE

CROSS-REFERENCE TO RELATED APPLICATIONS

This application is a national phase of International Application No. PCT/JP2020/019236, filed May 14, 2020, which claims priority to Japanese Patent Application No. 2019-152239, filed Aug. 22, 2019, both of which are hereby incorporated by reference in their entireties.

TECHNICAL FIELD

The present disclosure relates to a method for adjusting a position of a substrate. Particularly, the present disclosure relates to a method for adjusting a position of a substrate, by which, even for a substrate having warpage at a periphery, accurate center position adjustment or accurate angle adjustment can be performed.

BACKGROUND ART

Conventionally, in an aligner used in an alignment process of a semiconductor wafer (hereinafter, referred to as substrate), accurate center position adjustment of a substrate placed on a stage is performed in order to set accurate position and orientation of the substrate. In addition, angle adjustment using fiducial marks, such as an orientation flat and a notch, and various marks on the surface of the substrate is performed.

Since such an aligner handles a specular, transparent, or translucent substrate, or a substrate having a laser mark on the surface, a device including a camera that images a part of a periphery of a substrate is proposed (Patent Literature 1).

In order to image a periphery of a substrate, an aligner disclosed in Patent Literature 1 has a fixed-focus camera that focuses on a very narrow range, and a half mirror. The aligner images an edge of the substrate illuminated by a lighting device and the outside of the substrate, and detects a position where the luminance distribution in the taken image exhibits a significant change rate as a position of the edge of the substrate.

CITATION LIST

Patent Literature

Patent Literature 1: Unexamined Japanese Patent Application Publication No. 2016-063028.

SUMMARY OF INVENTION

Technical Problem

In an alignment process, an aligner rotates a substrate, measures a position of an edge of the substrate at a predetermined angle, and performs center position adjustment of the substrate and angle adjustment of a fiducial mark using the measured result. For example, the center position adjustment of the substrate and the angle adjustment of the fiducial mark are performed using an angle θ and a distance r from the rotation center of the substrate, which have been obtained from the measurement.

However, a distance between a camera lens and a substrate when a substrate having warpage is handled becomes different, depending on the state of the warpage, from a distance between the lens and a substrate in the case of a flat substrate having no warpage. Consequently, the optical magnification during imaging varies depending on the state of the warpage. Accordingly, a difference occurs in the measured value of the position of the edge, thereby resulting in a decrease in calculation accuracy of the center position of the substrate and the angle of the edge of the substrate.

Furthermore, in the aligner described in Patent Literature 1, when a substrate having warpage near the edge is handled, the stage on which the substrate is placed is moved up and down to the extent that the change rate of the luminance distribution is exhibited clearly in the taken image, so that the height of the substrate is corrected.

However, even when the camera is made to focus on the edge of the substrate by correcting the height of the substrate, the aligner only obtains the correction amount of the height of the substrate for four locations when rotating the substrate by 90°. In addition, the aligner only estimates the warpage along the entire periphery of the substrate by performing curve fitting of a spline curve according to a predetermined algorithm.

As described above, in the aligner described in Patent Literature 1, the accuracy of the center position adjustment of the substrate is decreased, and furthermore, the accuracy of the angle position adjustment of the fiducial mark provided on the edge is decreased. In addition, the state of the warpage along the entire periphery of the substrate cannot be accurately grasped.

It is an objective of the present disclosure to solve the problems of the above conventional art and provide a method for adjusting a position of a substrate, by which, for a substrate having warpage at a periphery, accurate center position adjustment or accurate angle adjustment can be performed.

Solution to Problem

In order to achieve the above objective, a method for adjusting a position of a substrate of the present disclosure, includes: measuring, using optical member, positions of edge portions of a substrate along an entire periphery of the substrate placed on a stage, thereby acquiring primary positional data indicating the positions of the edge portions; moving the stage in a predetermined direction by a predetermined amount and measuring, using the optical member, positions of the edge portions of the substrate along the entire periphery of the substrate after the stage has been moved, thereby acquiring secondary positional data indicating the positions of the edge portions after the stage has been moved; calculating, using the primary positional data and the secondary positional data, difference amounts between the positions of the edge portions before the stage has been moved and the positions of the edge portions after the stage has been moved; and calculating an optical magnification ratio of each of the edge portions from each of the difference amounts and an amount of movement of the stage and correcting each of the positions of the edge portions of the primary positional data based on the calculated optical magnification ratio of each of the edge portions, thereby acquiring corrected positional data.

In addition, preferably, the method for adjusting a position of a substrate further includes: adjusting a center position of the substrate or a position of a fiducial mark provided on the substrate based on the corrected positional data.

Preferably, the positions of the edge portions are indicated by, when imaging element including an image sensor images the substrate placed on the stage, positions on the image sensor.

Preferably, the optical magnification ratio is a ratio of an optical magnification when an image of a substrate having warpage is formed by the optical member to an optical magnification when an image of a tabular substrate having no warpage is formed by the optical member.

Preferably, the optical magnification ratio varies depending on a state of warpage on the substrate, and a coordinate indicating each of the positions of the edge portions of the corrected positional data is obtained by multiplying a coordinate indicating each of the positions of the edge portions of the primary positional data by an inverse of the optical magnification ratio.

Advantageous Effects of Invention

According to the configuration of the present disclosure, for a substrate having warpage at a periphery, accurate center position adjustment can be performed, or accurate angle adjustment can be performed.

BRIEF DESCRIPTION OF DRAWINGS

FIG. 11 is a flowchart of alignment processing according to the embodiment of the present disclosure;

DESCRIPTION OF EMBODIMENTS

Hereinafter, an embodiment of a method for adjusting a position of a substrate of the present disclosure is described with reference to the accompanying drawings.

Figure 1:
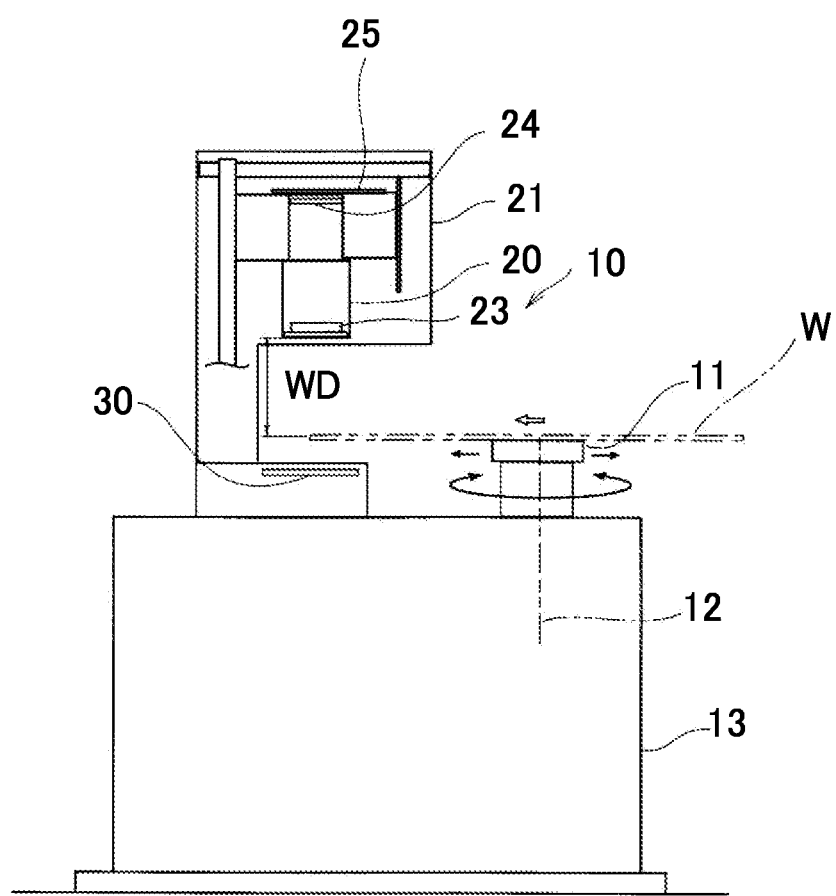
FIG. 1 is a front view schematically illustrating an aligner using a method for adjusting a position of a substrate according to the embodiment of the present disclosure.
Figure 2:
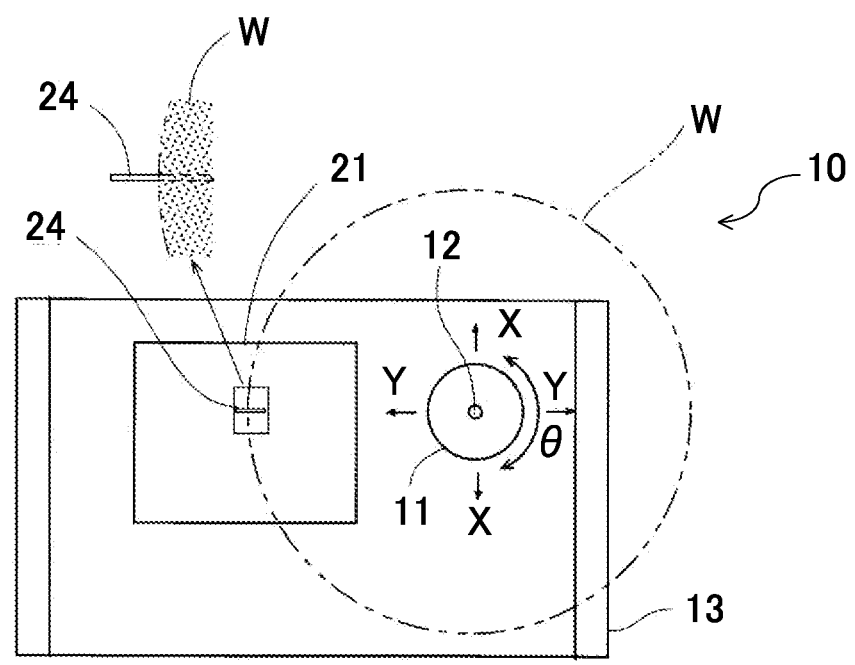
FIG. 2 is a plan view schematically illustrating the aligner illustrated in FIG. 1.

FIG. 1 is a front view of an aligner 10 that performs alignment of a substrate W by a method for adjusting a position of the substrate W according to the embodiment of the present disclosure. FIG. 2 is a plan view thereof. FIG. 1 illustrates a part of the internal configuration in addition to the appearance of the aligner 10 to facilitate understanding.

In the aligner 10, a drive system (not illustrated) embedded in a device body 13 (hereinafter, simply referred to as body 13) places the substrate W on the upper surface of a stage 11 projected from the upper surface of the body 13, and the stage 11 attracts the substrate W to support the substrate W. Then, the aligner 10 acquires positional information of an edge of the supported substrate W, and measures a center position of the substrate W and a position of a fiducial mark such as a notch formed on the edge of the substrate W to perform angle adjustment.

Particularly, an arm of a substrate transfer robot, which is not illustrated, transfers the substrate W to the aligner 10, and places the substrate W on the stage 11 having a round shape in a planar view. In this case, as indicated by virtual lines in FIG. 1 and FIG. 2, the substrate W is placed such that the center thereof approximately corresponds to a rotation axis (in other words, θ axis 12) of the stage 11. Then, the substrate W is attracted by a known vacuum chuck or the like (not illustrated) embedded in the stage 11 to be supported on the stage 11.

The stage 11 slides horizontally in X and Y directions illustrated in FIG. 2 by a drive system embedded in the body 13, which is not illustrated and is different from the above, and furthermore, rotates in forward and backward directions by the rotation axis (θ axis 12). When the drive system operates according to an instruction from a controller, which is not illustrated, the stage 11 provides predetermined parallel movement and rotation to the substrate W attracted and supported on the upper surface of the stage 11.

Configuration of Aligner

As illustrated in FIG. 1, in order to acquire the positional information of the edge of the substrate W on the stage 11, the aligner 10 includes a camera 20 that images the edge of the substrate W and a lighting device 30 for obtaining sufficient amount of light during imaging.

The camera 20 is housed in a box 21 standing from the body 13, which is provided such that a predetermined distance is maintained for imaging the edge of the substrate W supported on the stage 11. As the camera 20, a fixed-focus camera in which a focal point of a lens 23 is fixed is used. The lens 23 is positioned on the lower surface of the opened box 21. In addition, the lens 23 has a focal length such that the upper surface of the substrate is positioned roughly in the center of a depth of field. Furthermore, an image sensor 24 is arranged at a position of an imaging plane in a lens barrel housing the lens 23, and, for the image sensor 24, a predetermined working distance (WD) is set on the substrate side. In the present embodiment, as the image sensor 24, a complementary metal oxide semiconductor (CMOS) linear image sensor (hereinafter, CMOS linear image sensor is simply referred to as image sensor) is used.

According to an instruction from a controller 25 in the box 21, the camera 20 and the above drive system can synchronize the timing of imaging of the substrate W, the intervals of the timing of imaging, and the amount of rotation of the substrate W during imaging. In addition, the timing of imaging of the substrate W can be synchronized with when the substrate W is rotated by the stage 11 by a predetermined amount of rotation. Furthermore, the time intervals of imaging can be made to be intervals corresponding to the amount of rotation of the substrate W.

In addition, the camera 20 is an example of imaging element in the present description and claims. The lens 23 is an example of optical member.

Meanwhile, the lighting device 30 is arranged between the lens 23 and the upper surface of the body 13, and below the edge of the substrate W supported on the stage 11. In the present embodiment, as the lighting device 30, a LED lighting device that functions as a surface light source is used. Accordingly, as illustrated in an enlarged part of FIG. 2, the camera 20 images the rear surface side of the substrate W (the upper surface side of the substrate) illuminated by the lighting device 30 on the lower side. The image sensor includes a rod-shaped light receiving surface, and thus, an image divided into a dark section in which light is shielded by the substrate W and a bright section illuminated by incident light from the lighting device 30 is formed on the light receiving surface.

Method for Acquiring Positional Information of Edge

Here, a method for acquiring the positional information of the edge of the substrate W, which is basic information for performing the center position adjustment of the substrate W and the angle adjustment of the fiducial mark, and procedures of calculation of the center position of the substrate W and calculation of the angle of the fiducial mark are described with reference to FIG. 3 to FIG. 5.

The procedure of the calculation of the center position using the positional information of the edge of the substrate W is described with reference to FIG. 3 and FIG. 4. Generally, the substrate W is temporary placed on the stage 11 of the aligner 10 using an arm of a substrate transfer robot, and, in this case, the rotation axis (θ axis 12) of the stage 11 and the center position of the substrate W are sometimes slightly eccentric.

Figure 3:
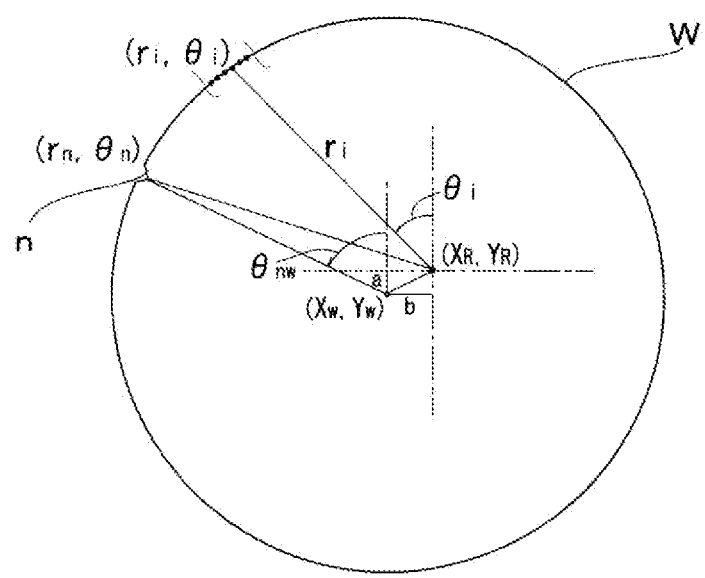
FIG. 3 is a plan view of an eccentric substrate whose position is to be adjusted by the method for adjusting a position of a substrate according to the embodiment.

FIG. 3 is a plan view of the eccentric substrate W whose position is to be adjusted by the method for adjusting the position of the substrate W according to the embodiment. In FIG. 3, positional information for acquiring the positional information of the edge of the substrate W is schematically illustrated on the substrate W.

As illustrated in FIG. 3, the center position $(X_W, Y_W)$ of the substrate W is deviated from the rotation center $(X_R, Y_R)$ of the substrate W, in other words, from the rotation axis (θ axis 12) of the stage 11. Consequently, the substrate W is in a state of being eccentric from the rotation axis (θ axis 12) by the amount of eccentricity (a, b).

Figure 4:
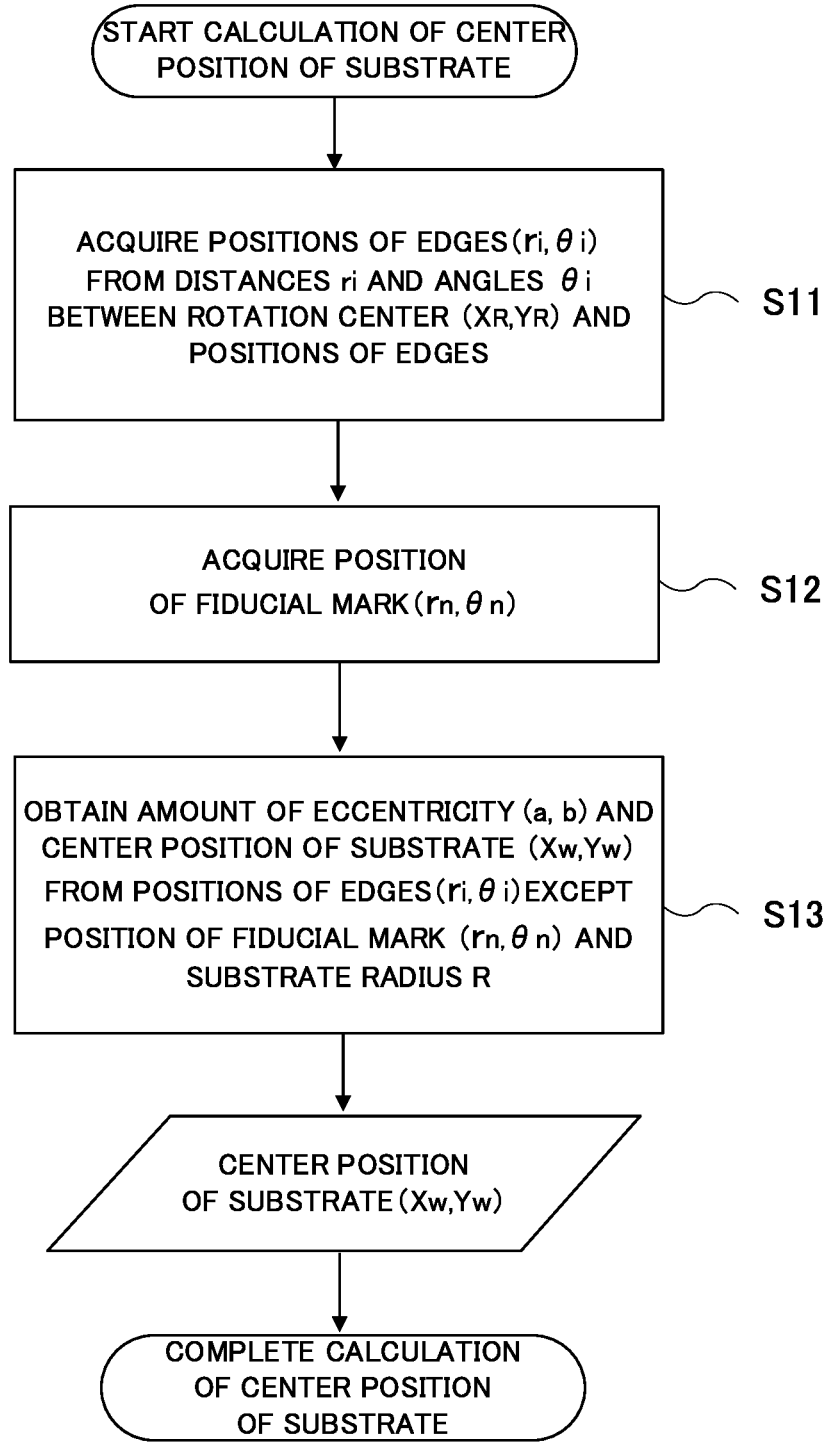
FIG. 4 is a flowchart of processing of calculating a center position of a substrate.

As illustrated in the flowchart of FIG. 4, the substrate W is rotated around the θ axis 12 by 360° in this state, and the substrate W is imaged by the camera 20 while the substrate W is rotated. Then, the position of the edge is measured using the taken image. Particularly, the substrate W is imaged at a predetermined frequency of sampling s (for example, s=20,000). Then, the positions of the edges $(r_i, θ_i)$ represented in polar coordinate data are acquired using the taken images (Step S11).

Then, a range of a notch n (for example, around $r_n, θ_n$) as the position of the fiducial mark is determined on the assumption that the substrate W has a round shape. Accordingly, the position of the fiducial mark $(r_n, θ_n)$ is acquired (Step S12).

Subsequently, a substrate radius R is calculated from these positions of the edges $(r_i, θ_i)$ except the position of the fiducial mark, and the amount of eccentricity (a, b) is obtained from the positions of the edges $(r_i, θ_i)$ used in the calculation and the calculated substrate radius R. Then, the center position of the substrate W $(X_W, Y_W)$ is finally calculated from the obtained amount of eccentricity (a, b) (Step S13).

Since there are various known methods for obtaining a central coordinate of an object from a rotation center of a subject, it goes without saying that a calculation method other than the present method can be appropriately adopted.

Figure 5:
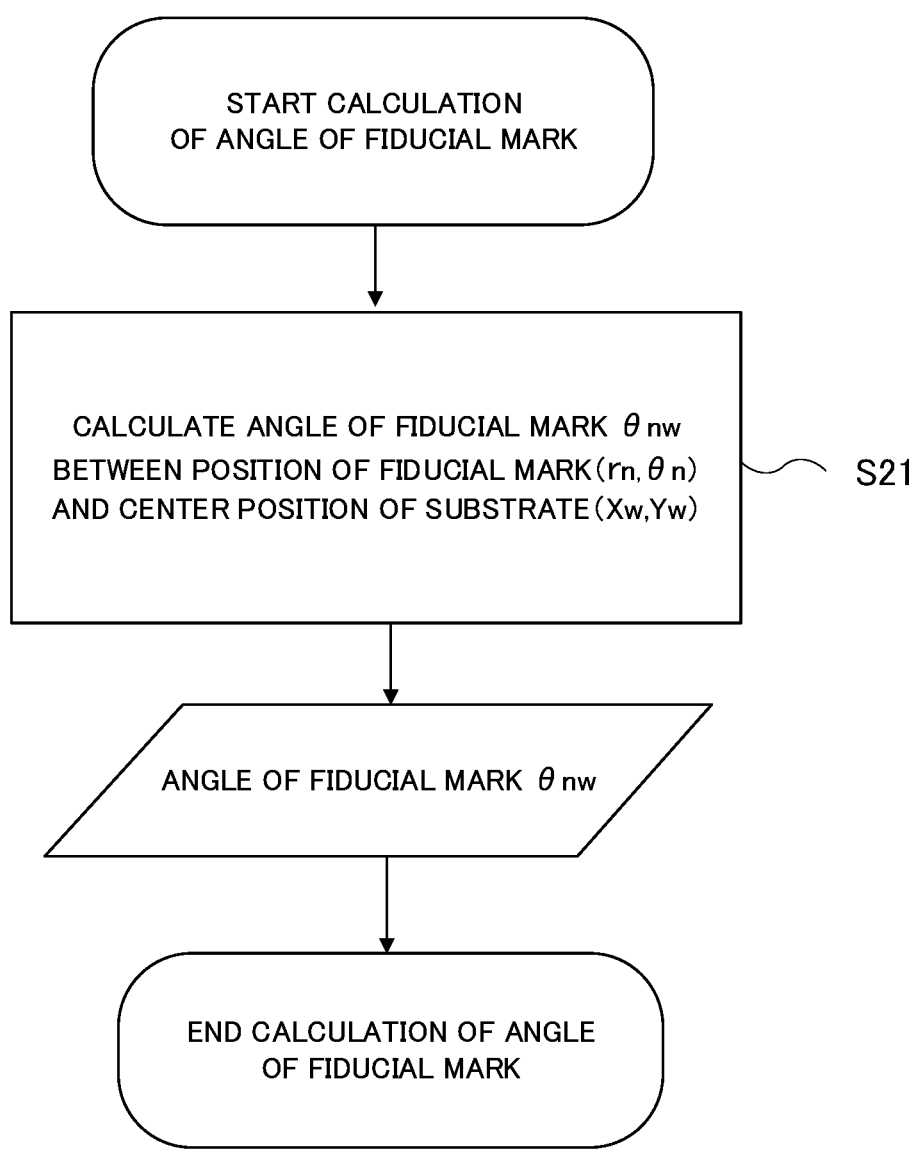
FIG. 5 is a flowchart of processing of calculating an angle of a fiducial mark.

Furthermore, regarding the calculation of the angle of the fiducial mark, an angle $θ_n w$ between the position of the fiducial mark $(r_n, θ_n)$ and the center position of the substrate $(X_W, Y_W)$, which is illustrated in FIG. 3, may be calculated (Step S21 illustrated in FIG. 5). In the calculation processes of the center position of the substrate and the angle of the fiducial mark, preferably, each coordinate value is treated after being transformed to a coordinate system suitable for calculation.

Figure 6A:
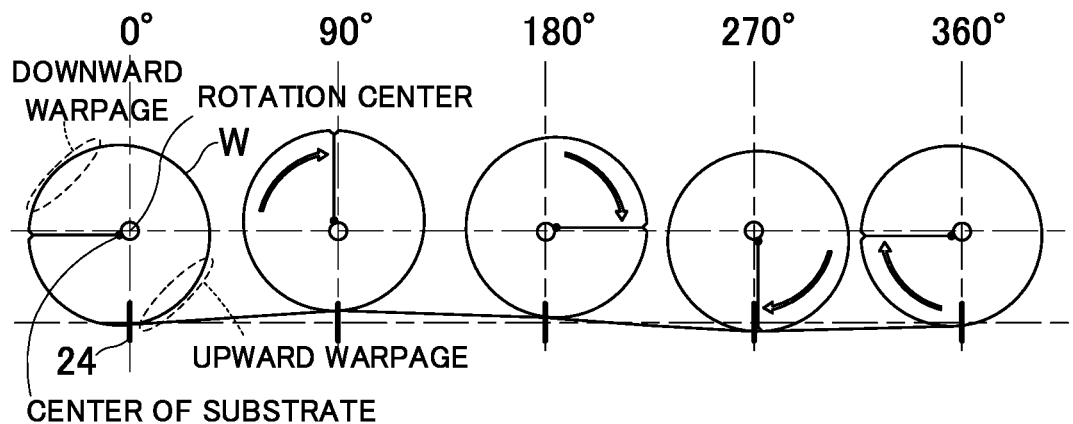
FIG. 6A is a developed view schematically illustrating, when the substrate is rotated one revolution around a θ axis, the substrate at each rotation angle, and schematically illustrating, when the substrate is imaged by an image sensor, positions of edges on the image sensor continuously.
Figure 6B:
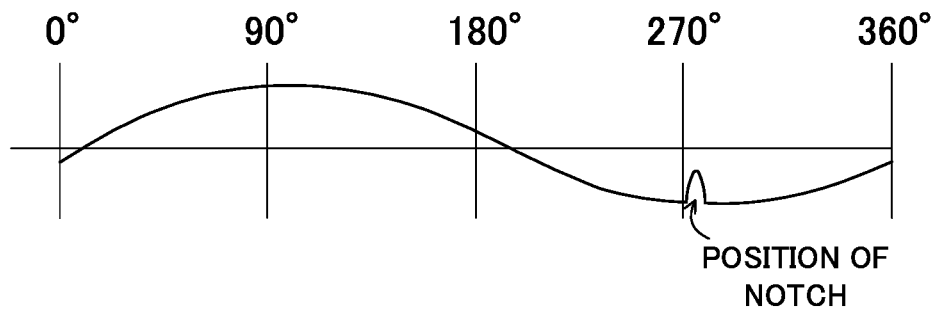
FIG. 6B is an enlarged developed view of the positions of the edges illustrated in FIG. 6A.

FIG. 6A is a developed view schematically illustrating, when the substrate W is rotated one revolution around the θ axis 12, the substrate W at each rotation angle, and schematically illustrating, when the substrate W is imaged by the image sensor 24, the positions of the edges on the image sensor 24 continuously. FIG. 6B is an enlarged developed view of the positions of the edges illustrated in FIG. 6A.

In the state illustrated in FIG. 6A, the substrate W is placed on the stage 11 such that the center position is eccentric from the rotation center. Therefore, the positions of the edges on the image sensor 24 draw a smooth curved line as illustrated in FIG. 6B when being plotted with respect to the rotation angles of the substrate W around the 0 axis 12. Since the curved line becomes a discontinuous state at the position of the fiducial mark (notch), in the case of acquiring the positional information of the edges, the position of the fiducial mark needs to be determined and eliminated as described above.

Influence of Warpage of Substrate

Figure 7A:
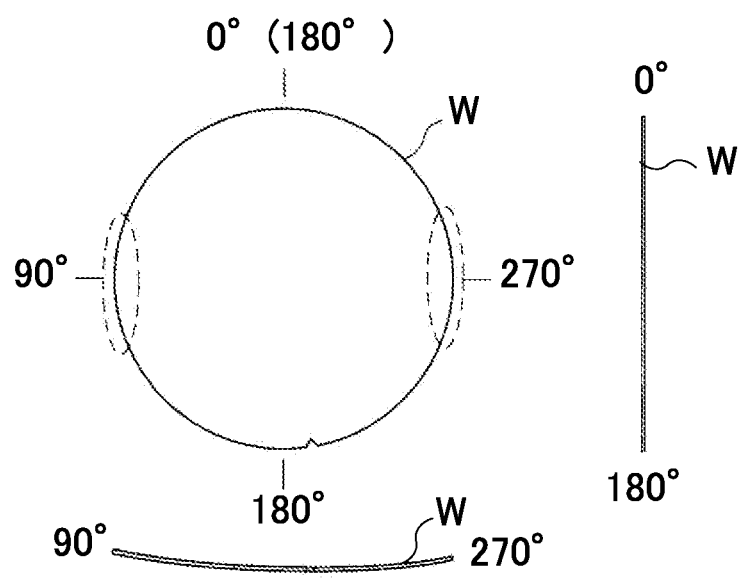
FIG. 7A is a plan view of the substrate having a curved surface shape due to warpage.
Figure 7B:
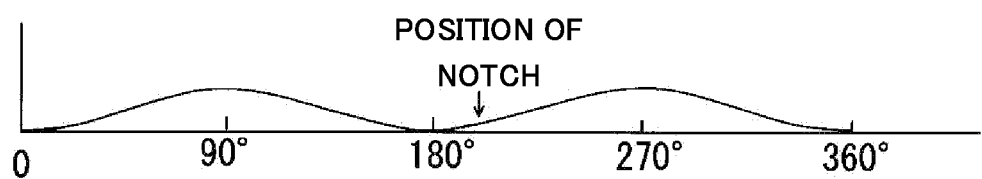
FIG. 7B is a developed view in which the positions of the edges of the substrate illustrated in FIG. 7A are developed in a circumferential direction.

Incidentally, in the aligner 10, alignment is sometimes performed for the substrate W having warpage without any problem in use. FIG. 7A is a plan view of the substrate W having a curved surface shape due to warpage. FIG. 7B is a developed view in which the positions of the edges of the substrate W illustrated in FIG. 7A are developed in a circumferential direction. FIG. 7A illustrates the substrate W in a side view in addition to the substrate W in a planar view to facilitate understanding.

Figure 6C:
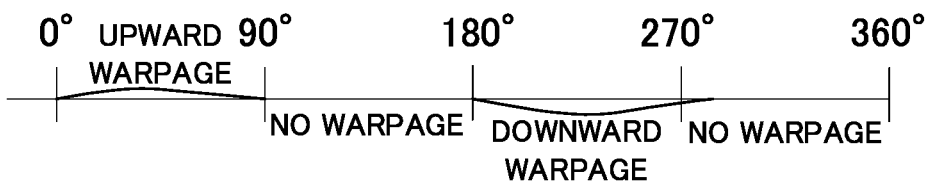
FIG. 6C is a developed view in which the amount of warpage is developed in a circumferential direction for indicating a state of warpage on predetermined positions of the edges of the substrate illustrated in FIG. 6A.

If a position having no warpage is a reference position, the positions of the edges of the substrate W having warpage illustrated in FIG. 7A vary smoothly to the upper side or the lower side from the reference position, as illustrated in FIG. 7B. In FIG. 7A and FIG. 7B, the warpage of the substrate W is maximized to the upper side at positions of angles of 90° and 270°. In addition, similarly to FIG. 7B, FIG. 6C is a developed view in which the amount of warpage is developed in a circumferential direction for indicating a state of warpage on predetermined positions of the edges of the substrate W illustrated in FIG. 6A.

Figure 8:
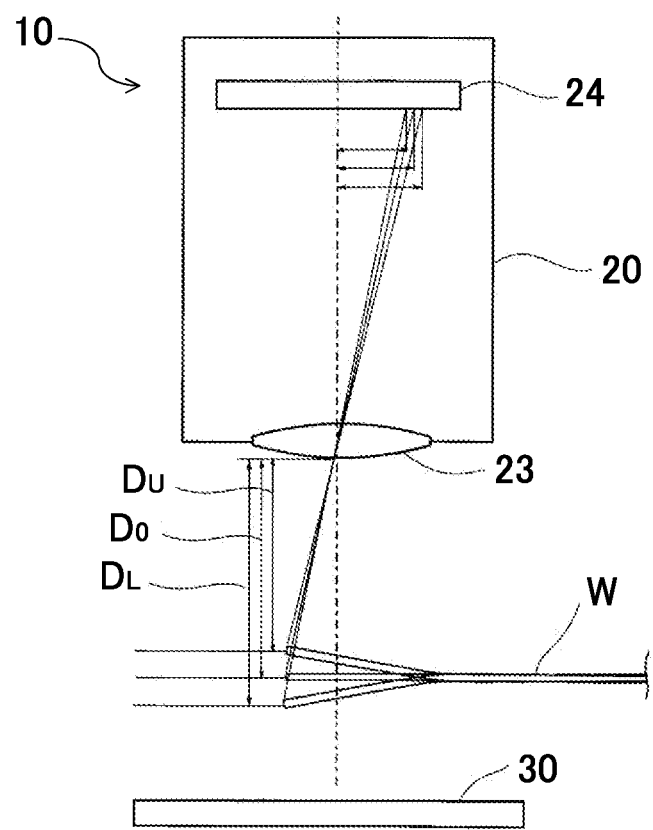
FIG. 8 is a conceptual view of an optical system of the aligner, which images the positions of the edges of the warped substrate.

FIG. 8 is a conceptual view of an optical system of the aligner 10, which images the positions of the edges of the warped substrate W. FIG. 8 illustrates the tabular substrate W having no warpage in addition to the substrate W having warpage for the purpose of illustration. Moreover, regarding the substrate W having warpage, the substrate W warped downwardly is illustrated in addition to the substrate W warped upwardly for the purpose of illustration. Consequently, in FIG. 8, the substrates W in three states are illustrated to be overlapped.

As illustrated in FIG. 8, in the substrate W having warpage, a distance between the edge and the lens 23 (hereinafter, referred to as substrate-side distance) $D_L$ or $D_U$ is different from a substrate-side distance $D_0$ of the tabular substrate W having no warpage. Since the aligner 10 uses a fixed-focus optical system, when the substrate-side distance $D_L$ or $D_U$ is different from the substrate-side distance $D_0$, a distance from the center of the lens 23 to a position of the image sensor 24, at which an image of the edge of the substrate W is formed, (hereinafter, referred to as sensor-side distance) is also different from a sensor-side distance of the tabular substrate W having no warpage, as illustrated in FIG. 8. Accordingly, the position on the image sensor 24, at which the image of the edge is formed, varies depending on the presence or absence of warpage and the degree of warpage. Consequently, the optical magnification varies. In FIG. 8, in order to make the explanation easier, the substrate-side distance is set as a distance from not the center of the lens 23 in the thickness direction (in other words, principal point) but the surface of the lens 23 on the substrate side (object side) to the substrate W.

Figure 6D:
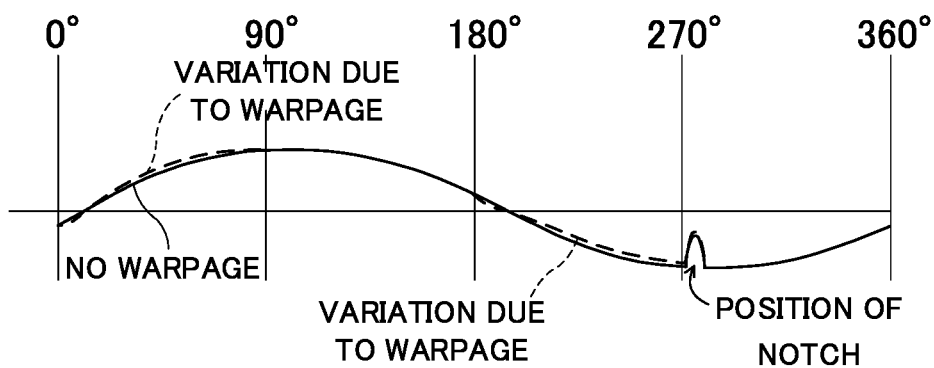
FIG. 6D is a developed view in which, when the substrate having warped edges is imaged by the image sensor, the positions of the edges on the image sensor are developed in a circumferential direction.

The variation of the optical magnification is described with reference to another drawing. FIG. 6D is a developed view in which, when the substrate W having warpage (refer to FIG. 6A and FIG. 6C) is imaged by the image sensor 24, the positions of the edges on the image sensor 24 are developed in a circumferential direction. In FIG. 6D, the positions of the edges of the substrate W having warpage are indicated by a dashed line.

As illustrated in FIG. 6D, the positions of the edges of the substrate W having warpage are deviated from the positions of the edges of the substrate W having no warpage. Consequently, the edges of the substrate W having warpage and the edges of the substrate W having no warpage are projected on different positions on the image sensor 24.

Figure 9:
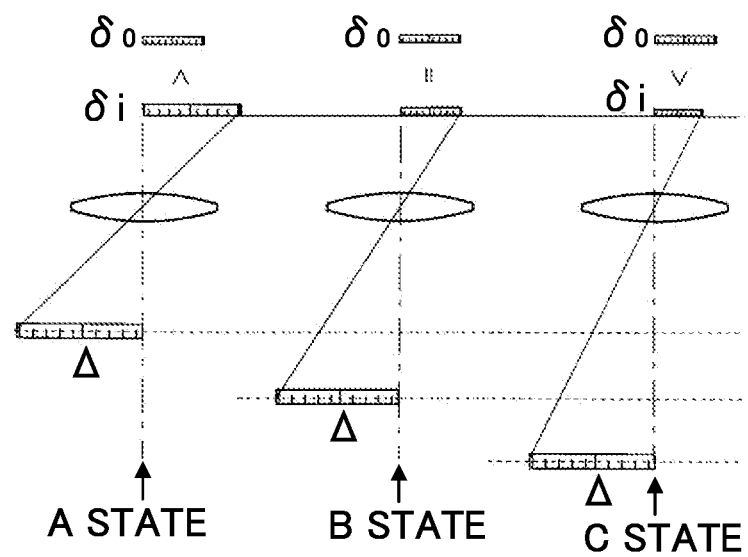
FIG. 9 is a conceptual view illustrating the variation of the optical magnification due to the warpage on the substrate.

FIG. 9 is a conceptual view illustrating the variation of the optical magnification due to the warpage on the substrate W. In FIG. 9, a scale is illustrated for indicating the variation of the optical magnification.

As illustrated in FIG. 9, in the case of the substrate W that is warped upwardly and has the edge on the upper side, the optical magnification becomes larger than that of the tabular substrate W. In addition, in the case of the substrate W that is warped downwardly and has the edge on the lower side, the optical magnification becomes smaller than that of the tabular substrate W. Therefore, when the optical magnification of the optical system is assumed to be constant in acquiring the positional information of the edge of the substrate W having warpage, the accuracy of the acquired positional information is obviously decreased.

Elimination of Influence of Warpage
(Definition of Resolution)

The present embodiment focuses the point that the optical magnification varies depending on the variation of the substrate-side distance, as illustrated in FIG. 9. In the present embodiment, the actual amount of movement of the substrate W when the substrate W is moved at a reference position (height), for example, in a horizontal direction, and the amount of movement on the sensor, which is projected on the image sensor 24 at that time, are measured, and the substrate-side distance of the substrate W having warpage is estimated from the positional information of the edge projected on the image sensor 24 using a correspondence relation of the obtained amount of movement on the sensor to the obtained actual amount of movement (refer to FIG. 10A and FIG. 10B).

(Resolution at Reference Distance)

As a precondition for eliminating the influence of the warpage of the substrate W, first, a resolution Re is defined. In other words, a ratio of the amount of movement of an end of an object from a reference distance between the lens 23 and the object (hereinafter, referred to as reference distance) to the amount of movement of the end of the object projected on an imaging surface (in other words, light receiving surface described above) on the image sensor 24 is defined as the resolution Re.

More particularly, when the amount of movement of the end of the object (the amount of movement of the stage) is A (unit is mm) and the amount of movement of the end of the object projected on the imaging surface of the image sensor is B (unit is pixel), the resolution Re is represented by Re=B/A (pixel/mm) . . . (Formula 1).

Therefore, the amount of movement δ (pixel) of the end of the object on the image sensor 24 when the end of the object is moved (slid) by Δ (mm) is δ=Re×Δ(pixel) . . . (Formula 2).

(Setting of Optical Magnification Ratio)

The B state illustrated in FIG. 9 indicates the amount of movement $δ_0$ of the end of the object projected on the imaging surface on the image sensor 24 when the end of the object located at the reference distance from the lens 23 is moved by a predetermined amount Δ. In FIG. 9, the amount of movement $δ_0$ is used as a reference value and illustrated by a scale. In this case, the optical magnification $R_0$ at the reference distance is $R_0=δ_0/Δ$. When a distance between the lens 23 and the end of the object (object-side distance) is unknown and the amount of movement of the end of the object on the imaging surface of the image sensor 24 when the end of the object is moved by $Δ_i$ (mm) is $δ_i$ (pixel), the following relations are satisfied between the measured value $δ_i$ (pixel) and the reference value $δ_0$ (pixel).

$δ_i/δ_0>1$ . . . The object is located nearer than the reference distance (A state illustrated in FIG. 9).

$δ_i/δ_0=1$ The object is located at the reference distance (B state illustrated in FIG. 9).

$δ_i/δ_0<1$ . . . The object is located farther than the reference distance (C state illustrated in FIG. 9).

(Correction of Positional Data)

Figure 10A:
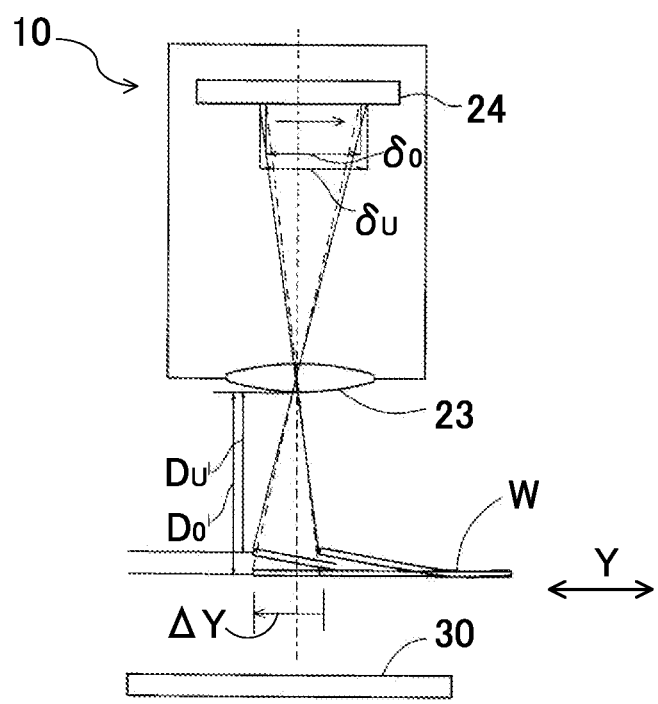
FIG. 10A is a conceptual view of the optical system included in the aligner when the substrate whose edge is warped upwardly and whose substrate-side distance is $D_U$ is moved in a Y direction by a predetermined amount.
Figure 10B:
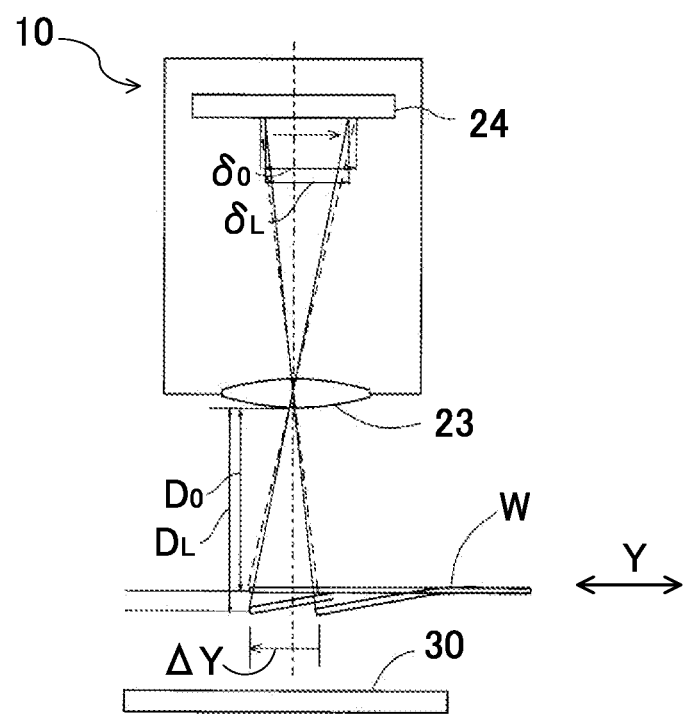
FIG. 10B is a conceptual view of the optical system included in the aligner when the substrate whose edge is warped downwardly and whose substrate-side distance is $D_L$ is moved in a Y direction by a predetermined amount.

FIG. 10A is a conceptual view of the optical system included in the aligner 10 when the substrate W whose edge is warped upwardly and whose substrate-side distance is $D_U$ is moved in a Y direction by a predetermined amount ΔY. FIG. 10B is a conceptual view of the optical system when the substrate W whose edge is warped downwardly and whose substrate-side distance is $D_L$ is moved in a Y direction by a predetermined amount ΔY. FIG. 10A and FIG. 10B also illustrate the optical system when the tabular substrate W is moved in a Y direction by a predetermined amount ΔY to facilitate understanding.

As illustrated in FIG. 10A, in the case of the substrate W whose edge is warped upwardly, the amount of movement $\delta_U$ on the imaging surface of the image sensor 24 is larger than the amount of movement $\delta_0$ in the case of the tabular substrate W. In addition, as illustrated in FIG. 10B, in the case of the substrate W whose edge is warped downwardly, the amount of movement $\delta_L$ on the imaging surface of the image sensor 24 is smaller than the amount of movement $\delta_0$ in the case of the tabular substrate W. In this case, if an optical magnification ratio R of the optical magnification at the reference distance $D_0$ and the optical magnification at the distance $D_U$ (or the distance $D_L$) away from the reference distance $D_0$ by a predetermined distance is found, positional data before the movement is corrected by multiplying the positional data before the movement by an inverse thereof (1/R), and positional data in a state having warpage can be converted into positional data in a state having no warpage.

Procedure of Alignment According to Present Embodiment

Figure 12:
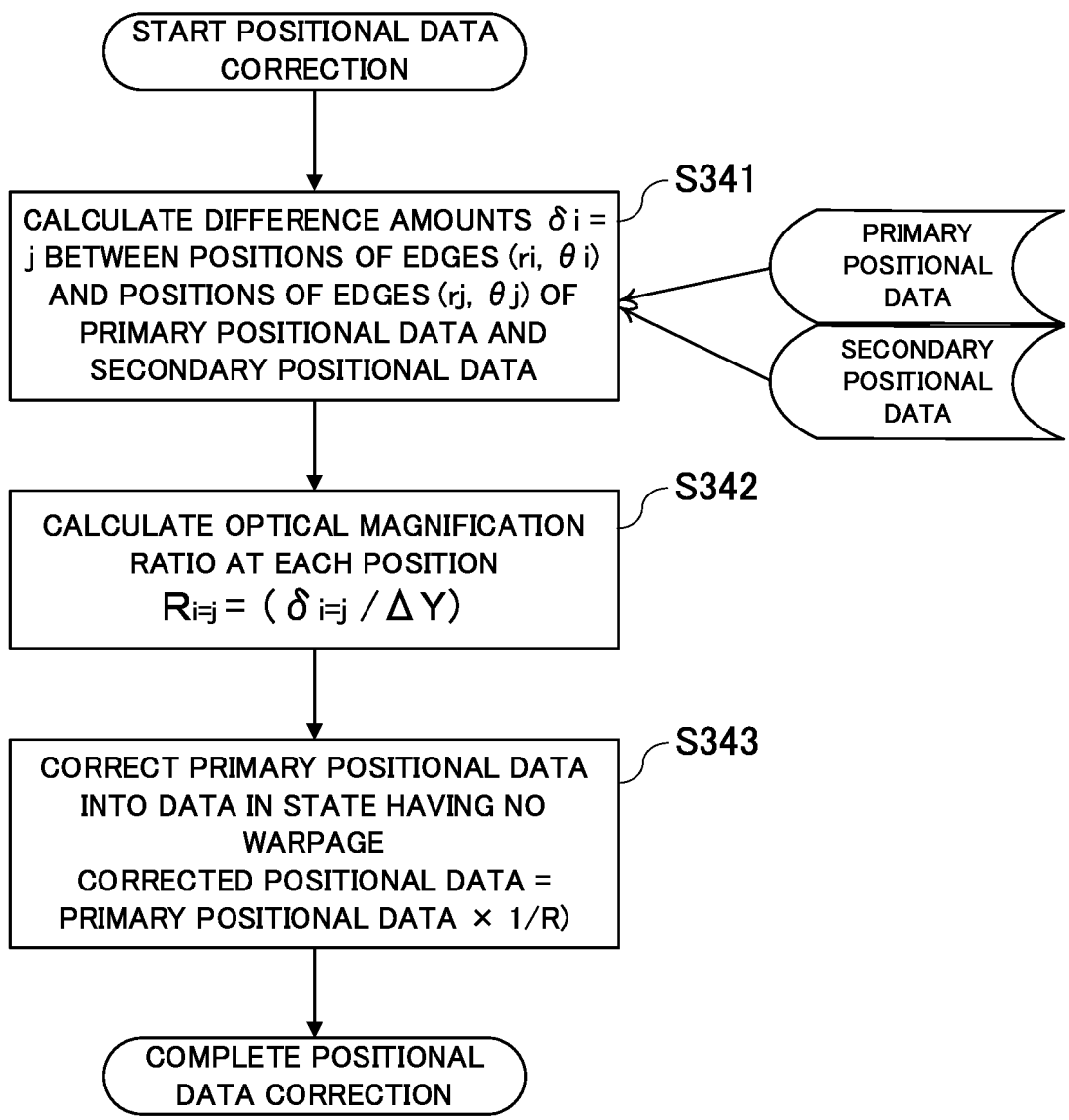
FIG. 12 is a flowchart of correction processing of positional data according to the embodiment of the present disclosure.

FIG. 11 is a flowchart of alignment processing, and FIG. 12 is a flowchart of correction processing of positional data. As illustrated in FIG. 11 and FIG. 12, in the alignment processing, the positional data is corrected along the entire periphery of the substrate W having warpage at a periphery using the above-described relation of the optical magnification ratio R. Furthermore, the calculation of the center position of the substrate and the calculation of the angle of the fiducial mark are performed using the positional data after the correction. Hereinafter, a detailed description is provided with reference to FIG. 11 and FIG. 12.

Although not illustrated, first, the substrate W having warpage is placed on the stage 11 of the aligner 10 to be supported on the stage 11. Subsequently, the substrate W is rotated around the rotation axis (θ axis 12) by rotating the rotation axis (θ axis 12) of the stage 11, and the edges of the substrate W are imaged by the camera 20 while the substrate W is rotated. Then, in each of the taken images, a coordinate in the image of the edge image area in which the edge of the substrate W is imaged is measured. Accordingly, as illustrated in FIG. 11, primary positions of the edges ($r_i$, $\theta_i$) are acquired along the entire periphery of the substrate W (Step S31). Then, the acquired positional data (primary positional data) is stored in a memory.

After the primary positions of the edges are acquired, the rotation axis (θ axis 12) of the stage 11 that supports the substrate W is slid in a Y direction by a predetermined amount (ΔY) (Step S32, refer to FIG. 2, FIG. 10A, and FIG. 10B). In the present embodiment, ΔY=2 mm.

Subsequently, similarly to Step S31, the substrate W is rotated around the rotation axis (θ axis 12) of the stage 11 after the movement, and the edges of the rotating substrate W are imaged by the camera 20. Then, in each of the taken images, a coordinate in the image of the edge image area is measured. Accordingly, secondary positions of the edges ($r_j$, $\theta_j$) are acquired along the entire periphery of the substrate W (Step S33). The positional data (secondary positional data) is stored in the memory.

Then, positional data correction is performed based on the primary positional data and the secondary positional data (Step S34).

As illustrated in FIG. 12, in processing of the positional data correction, the primary positional data and the secondary positional data are retrieved from the memory, and difference amounts $\delta_{i=j}$ between the positions of the edges ($r_i$, $\theta_i$) and the positions of the edges ($r_j$,$\theta_j$) of the retrieved primary positional data and secondary positional data are calculated along the entire periphery (Step S341).

Next, an optical magnification ratio at each position is calculated (Step S342). Here, the ratio R is $R_{j=j}(\delta_{i=j}/\Delta Y)$.

Subsequently, the primary positional data is corrected into data in a state having no warpage using the calculated ratio R (Step S343). Particularly, each of the primary positions of the edges ($r_i$, $\theta_i$) of the primary positional data is corrected using Formula 3 below. Accordingly, corrected positional data indicating the position of the edge in a state having no warpage is obtained. Consequently, the data is updated. Here, the corrected position of the edge in Formula 3 means the corrected positional data illustrated in FIG. 12. The primary position of the edge means the primary positional data illustrated in FIG. 12. Accordingly, the positional data correction is completed.

Corrected position of edge=(Primary position of edge×1/R) (Formula 3)

When the positional data correction is completed, the procedure is returned to the alignment processing of FIG. 11. Subsequently, the calculation of the center position of the substrate is performed using the positional data after the correction (Step S35). Next, the calculation of the angle of the fiducial mark is performed (Step S36). After that, the substrate W is rotated and slid to modify the position of the substrate W (Step S37). According to the above steps, the alignment processing is finished. According to the alignment processing, for the substrate W having warpage, the center position adjustment of the substrate W from which the influence of the warpage is eliminated, and the angle adjustment of the fiducial mark can be performed with a high degree of accuracy.

Figure 13:
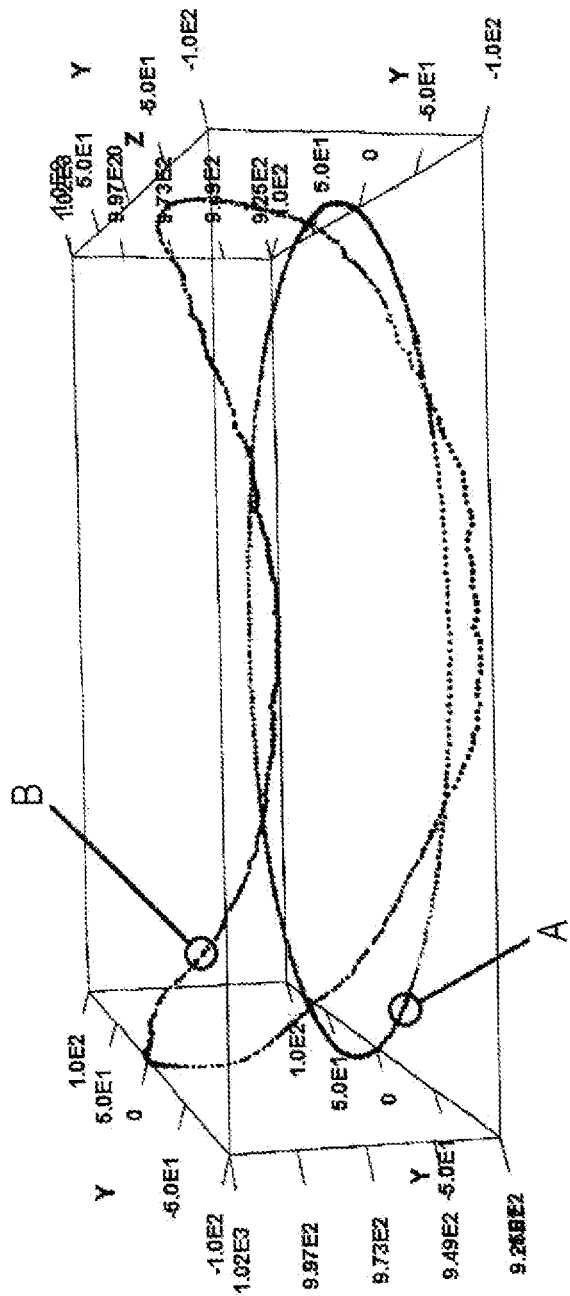
FIG. 13 is a CG model view in which a state of the warpage on the substrate is visually illustrated in three dimensions.

In addition, as illustrated in FIG. 13, in a computer graphics (CG) model using a personal computer, the edges of the substrate W are indicated by a point cloud and the amount of warpage is rendered in a three-dimensional form, so that the warpage orientation (generated location) and the amount of warpage can be visually confirmed with ease. FIG. 13 renders both a point cloud A illustrating the reference heights of the edges of the substrate W having no warpage and a point cloud B illustrating the heights of the edges of the substrate W having warpage. For example, in a test for checking, when a defined value is set for the amount of warpage of the substrate W as a product, whether the amount of warpage satisfies the defined value, a point cloud in a range exceeding the defined value is indicated by colors that are distinguished depending on the amount of warpage, for example, yellow (within the allowable range) to red (beyond the allowable range), so that the test result for the state of warpage can be visually confirmed and grasped with ease. Accordingly, the efficiency and the accuracy in quality control of the substrate W can be increased.

Although the embodiment according to the present disclosure has been described above, the present disclosure is not limited to the above-described embodiment. For example, although the substrate has a round shape in a planar view in the above-described embodiment, the substrate may have any shape in a planar view in the present disclosure. The substrate may have a shape other than the round shape in a planar view, for example, a rectangular shape in a planar view. In addition, although the image sensor includes the rod-shaped light receiving surface in the above-described embodiment, the light receiving surface of the image sensor may have any shape. The light receiving surface may have a rectangular shape.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2019-152239, filed on Aug. 22, 2019, the entire disclosure of which is incorporated by reference herein.

REFERENCE SIGNS LIST

10 Aligner
11 Stage
12 Rotation axis (θ axis)
20 Camera
23 Lens
24 Image sensor
30 Lighting device
W Substrate

The invention claimed is:

1. A method for adjusting a position of a substrate, comprising:

measuring, using an optical member, positions of edge portions of a substrate along an entire periphery of the substrate placed on a stage, thereby acquiring primary positional data indicating the positions of the edge portions;

moving the stage with a parallel movement in a direction along a surface of the substrate by a predetermined amount and measuring, using the optical member, positions of the edge portions of the substrate along the entire periphery of the substrate after the stage has been moved, thereby acquiring secondary positional data indicating the positions of the edge portions after the stage has been moved;

calculating, using the primary positional data and the secondary positional data, difference amounts between the positions of the edge portions before the stage has been moved and the positions of the edge portions after the stage has been moved, along the entire periphery of the substrate; and calculating an optical magnification ratio of each of the edge portions from each of the difference amounts and an amount of movement of the stage and correcting each of the positions of the edge portions of the primary positional data based on the calculated optical magnification ratio of each of the edge portions, thereby acquiring corrected positional data.

2. The method according to claim 1, further comprising:

adjusting a center position of the substrate or a position of a fiducial mark provided on the substrate based on the corrected positional data.

3. The method according to claim 1, wherein the positions of the edge portions are indicated by, when an imaging element including an image sensor images the substrate placed on the stage, positions on the image sensor.

4. The method according to claim 1, wherein the optical magnification ratio is a ratio of an optical magnification when an image of a substrate having warpage is formed by the optical member to an optical magnification when an image of a tabular substrate having no warpage is formed by the optical member.

5. The method according to claim 1, wherein the optical magnification ratio varies depending on a state of warpage on the substrate, and a coordinate indicating each of the positions of the edge portions of the corrected positional data is obtained by multiplying a coordinate indicating each of the positions of the edge portions of the primary positional data by an inverse of the optical magnification ratio.

* * * * *